US006693031B2

(12) United States Patent
Advocate, Jr. et al.

(10) Patent No.: US 6,693,031 B2
(45) Date of Patent: Feb. 17, 2004

(54) FORMATION OF A METALLIC INTERLOCKING STRUCTURE

(75) Inventors: Gerald G. Advocate, Jr., Pleasant Valley, NY (US); Francis J. Downes, Jr., Vestal, NY (US); Luis J. Matienzo, Endicott, NY (US); Ronald A. Kaschak, Vestal, NY (US); John S. Kresge, Binghamton, NY (US); Daniel C. Van Hart, Conklin, NY (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 10/039,710

(22) Filed: Jan. 4, 2002

(65) Prior Publication Data

US 2002/0056890 A1 May 16, 2002

Related U.S. Application Data

(62) Division of application No. 09/517,847, filed on Mar. 2, 2000, now Pat. No. 6,348,737.

(51) Int. Cl.$^7$ ............................................... H01L 21/44
(52) U.S. Cl. ........................................ 438/665; 438/666
(58) Field of Search ................................. 438/666, 665; 257/773, 774, 775; 205/158, 164, 168, 169, 187

(56) References Cited

U.S. PATENT DOCUMENTS

| | | | | |
|---|---|---|---|---|
| 3,167,490 A | * | 1/1965 | Friedman ..................... 205/125 |
| 4,968,383 A | * | 11/1990 | Volkmann et al. ............. 216/65 |
| 5,593,606 A | | 1/1997 | Owen et al. |
| 5,683,758 A | * | 11/1997 | Evans et al. ................. 427/555 |
| 5,702,584 A | * | 12/1997 | Goenka et al. ............. 205/158 |
| 5,779,921 A | | 7/1998 | Haslow et al. |
| 5,861,076 A | * | 1/1999 | Adlam et al. ................ 156/281 |
| 5,960,251 A | * | 9/1999 | Brusic et al. ................ 428/551 |

OTHER PUBLICATIONS

HDIS Using Laser Ablated Microvias, Circuitree, Mar. 1998, Dr. Mason Hu, 5 pages.

(List continued on next page.)

Primary Examiner—Craig A. Thompson
Assistant Examiner—William Vesperman
(74) Attorney, Agent, or Firm—Schmeiser, Olsen & Watts; William H. Steinberg

(57) ABSTRACT

An electronic structure including a metallic interlocking structure for bonding a conductive plated layer to metal surface, and a method of forming the electronic structure. The method provides a substrate having a metallic sheet within a dielectric layer. The metallic sheet includes a metal such as copper. An opening in the substrate, such as a blind via, is formed by laser drilling through the dielectric layer and partially through the metallic sheet. If the opening is a blind via, then the laser drilling is within an outer ring of the blind via cross section using a laser beam having a target diameter between about 20% and about 150% of a radius of the blind via cross section. A surface at the bottom of the opening, called a "blind surface," includes a metallic protrusion formed by the laser drilling, such that the metallic protrusion is integral with a portion of the blind surface. The metallic protrusion includes the metal of the metallic sheet and at least one constituent element from the dielectric layer. The metallic protrusion is then etched to form a metallic interlocking structure that is integral with the portion of the blind surface. The metallic interlocking structure includes discrete metallic fibers, with each metallic fiber having a curved (or curled) geometry. Each metallic fiber has its own unique composition that includes the metal, at least one constituent element of the dielectric layer, or both.

18 Claims, 9 Drawing Sheets

OTHER PUBLICATIONS

Successful Implementation of UV Laser Drilling Technology in High–Volume Production A Board Fabricator's Perspective, Circuitree, Dec. 1999, Sudhaker Raman et al., 5 pages.

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

"Process Considerations in the Fabrication of Teflon Printed Circuit Boards", by Light et al, 1994 Proceedings, 44 Electronic Components & Technology Conference, 5/94.

* cited by examiner

FORMATION OF A METALLIC INTERLOCKING STRUCTURE

This application is a divisional of Ser. No. 09/517,847, filed on Mar. 2, 2000 now U.S. Pat. No. 6,348,737.

BACKGROUND OF THE INVENTION

1. Technical Field

The present invention relates to an electronic structure that includes a metallic interlocking structure for bonding a metallic plating to metal surface, and to a method of forming the electronic structure.

2. Related Art

In plating copper onto a microvia in the form of a blind via, electroless plating of copper is typically used to coat the sidewalls and the metallic bottom surface of the blind via to provide electrical commoning for subsequent copper electroplating on the electroless coat of copper. Reliability of a copper-plated blind via depends on an adhesive bond between the plated copper and the metallic bottom surface of the blind via. If the adhesive bond is weak, the copper plating may separate from the bottom metallic surface during periods of thermal stress testing or during sustained operation in the field. Similar reliability concerns exist for other geometries, such as for copper plating in a channel over a metallic surface at the bottom of the channel.

Thus a method is needed to provide a strong bond between plated copper and a metallic surface onto which the copper is plated.

SUMMARY OF THE INVENTION

The present invention provides a method for forming a structure, comprising the steps of:

providing a substrate having a metallic sheet interior to a dielectric layer, said metallic sheet including a metal;

laser drilling a blind opening through the dielectric layer and partially through the metallic sheet, said laser drilling creating a metallic protrusion that is integral with a portion of the metallic sheet, said metallic protrusion having metallic strands such that each metallic strand includes the metal and at least one constituent element from the dielectric layer; and etching a portion of the metallic protrusion to form a metallic interlocking structure that is integral with the portion of the metallic sheet and projects into the blind opening.

The present invention provides a structure, comprising:

a substrate having a metallic sheet interior to a dielectric layer, said metallic sheet including a metal;

a blind opening through the dielectric layer and partially through the metallic sheet;

a metallic interlocking structure coupled to a blind surface of the blind opening and projecting into the blind opening, wherein the metallic interlocking structure is integral with a portion of the metallic sheet, wherein the metallic interlocking structure includes metallic fibers, and wherein each metallic fiber has a curved geometry and has its own unique composition that includes material selected from the group consisting of the metal, at least one constituent element of the dielectric layer, and combinations thereof.

The present invention has the advantage of provide a strong bond between a metallic plating, such as plated copper, and a metal surface which receives the metallic plating, so as to significantly improve the reliability of the plating bond.

The present invention has the advantage of providing a plating bond that is strong enough to allows metal surfaces to be plated even if such metal surfaces are difficult or impossible to be plated without the present invention.

The present invention has the advantage of forming a reliable plating in a variety of geometries, including a plated blind via and a plated channel.

BRIEF DESCRIPTION OF THE DRAWINGS

FIGS. 6A, 5B, 6C, and 6D depict the metallic interlocking structure of FIG. 4 as actually reduced to practice.

DETAILED DESCRIPTION OF THE INVENTION

Figure 1:
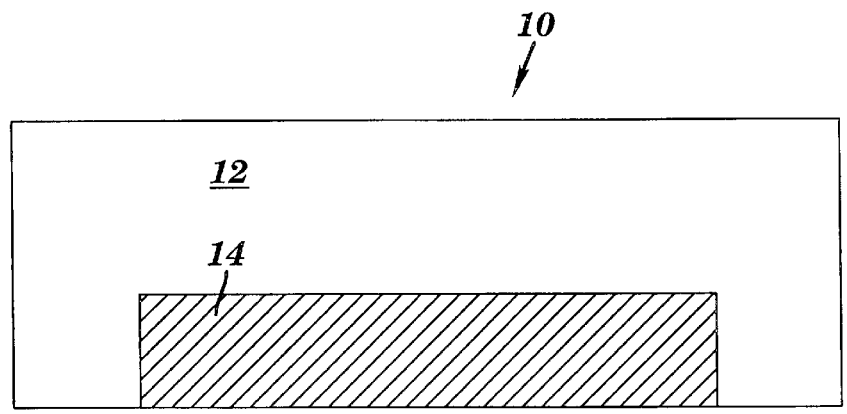
FIG. 1 depicts a front cross-sectional view of a substrate having a metallic sheet interior to a dielectric layer, in accordance with preferred embodiments of the present invention.

FIG. 1 illustrates a front cross-sectional view of a substrate 10 having a metallic sheet 14 interior to a dielectric layer 12, in accordance with preferred embodiments of the present invention. The metallic sheet 14 includes a metal capable of being plated with a metallic plating material. The metallic sheet 14 preferably includes copper, but may alternatively include other etchable metals such as copper alloys, brass, bronze, and palladium. The dielectric layer 12 preferably includes an organic dielectric material such as, inter alia, an allylated polyphenylene ether resin having a silica filler. Other dielectric materials that could be utilized in the dielectric layer 12 include polyimide, epoxy, and silica-filled teflon dielectric material.

Figure 2:
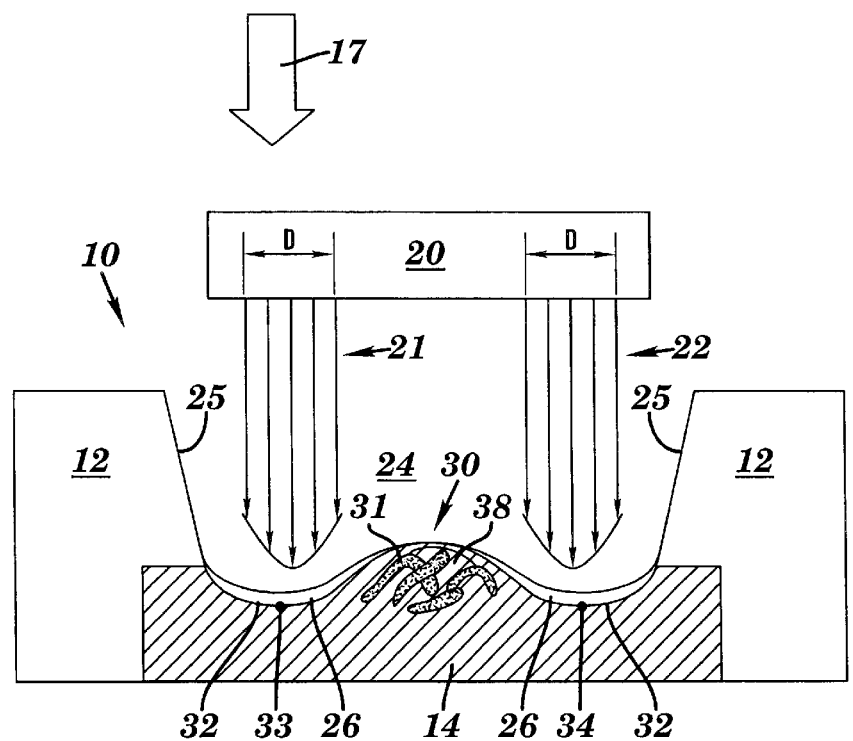
FIG. 2 depicts FIG. 1 after laser light has drilled into the dielectric layer and through a top portion of the metallic sheet to form, within the substrate, a blind opening and a metallic protrusion coupled to a portion of a blind surface of the blind opening.
Figure 7:
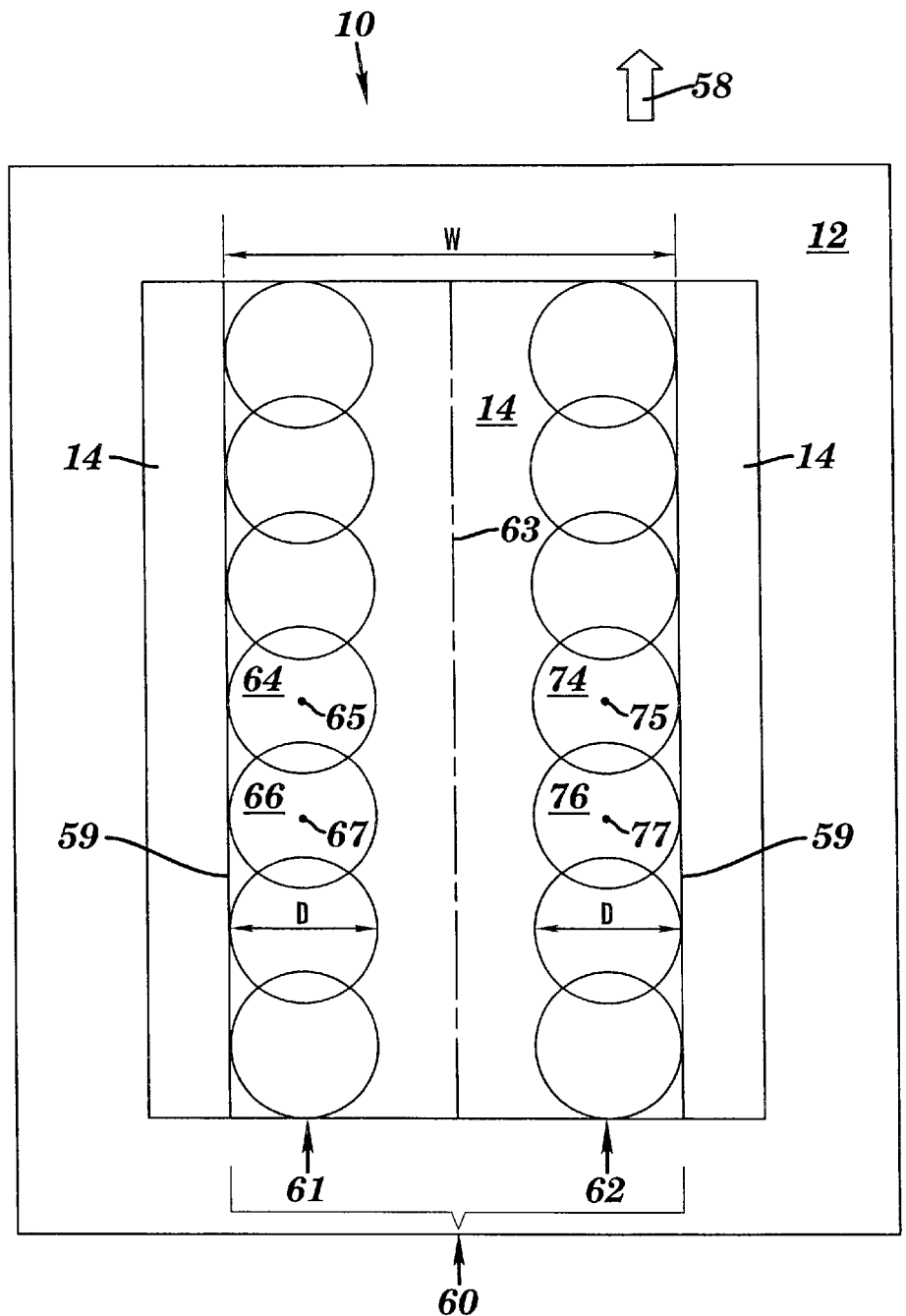
FIG. 7 depicts a top view of the substrate of FIG. 2, wherein the blind opening includes a blind channel.

FIG. 2 depicts FIG. 1 after a beam of laser light 21 and a beam of laser light 22, both from a laser source 20, have ablated a portion of the dielectric layer 12 and a top portion of the metallic sheet 14, to form a blind opening 24 within the substrate 10. A blind opening is a opening that does not penetrate the entire thickness of the substrate 10 and thus includes a bottom surface, called a "blind surface," at the bottom of the opening. The blind opening 24 has sidewalls 25. The laser light 21 and the laser light 22 may represent the same laser beam at different instances of time, as explained infra in conjunction with FIGS. 4 and 5. Alternatively, the laser light 21 and the laser light 22 may represent different laser beams synchronized in time, as explained infra in conjunction with FIGS. 7 and 8. The laser beams 21 and 22 interact with the material to be ablated ("target material") at circular sites in the target material ("target circles"). The target circles have a diameter, called a "target diameter," of magnitude D. Preferably, the laser ablation of the target material is accomplished by laser trepanning, which includes sequentially positioning the target circles of laser beam 21 (or 22) on overlapping portions of the target material, such that a displacement ("target displacement") between centers of target circles of successive pulses is less than a target diameter. Alternatively, the target displacement may exceed the target diameter, which enables the present invention to be implemented without using laser trepanning. See FIG. 3A and col. 5, lines 31–42 of U.S. Pat. No. 5,593,606 (Owen et al., 1997, hereby incorporated by reference) for a discussion of laser trepanning. FIGS. 4 and 7, described infra, will illustrate laser trepanning in conjunction with the present invention.

The physical characteristics of the laser light 21 and the laser light 22 include: a wavelength preferably between about 260 nanometers (nm) and about 540 nm, an average power preferably between about 0.01 millijoules/pulse and about 0.10 millijoules/pulse, a temporal pulse width preferably between about 10 nanosec and about 150 nanosec, and a pulse repetition rate preferably between about 4 kilohertz (kHz) and about 20 kHz. The target displacement is preferably between about 1 micron and about 25 microns.

The intensity of the laser light is generally inhomogeneous across the target circle with the highest intensity at the center of the target circle and decreasing monotonically with distance from the center of the target circle along a target diameter. The spatial shape of the laser intensity across a target diameter may be approximately gaussian. The shape of a blind surface 32 generated by the laser beams 21 and 22 reflects the spatial shape of the laser intensity, giving rise to two troughs: one under the laser beam 21 and the other under the laser beam 22. Thus, the points 33 and 34 on the blind surface 32 of deepest laser penetration in the direction 17 are at about the lateral center of the troughs and about at the center of the target circles of the laser beams 21 and 22, respectively.

FIG. 2 shows the blind surface 32 as being formed at the metallic sheet 14 after the laser beams 21 and 22 have removed material from the dielectric layer 12 located above the blind surface 32. Each cycle of the laser beams 21 and 22 removes a thickness in the direction 17 of material from the dielectric layer 12. For example, if a laser emits beams that trace a circular path, then each such circular tracing is one complete cycle. Thus, several laser cycles (e.g., 4 or 5 cycles) may be required before the laser beams 21 and 22 remove enough dielectric material from the dielectric layer 12 to gain access to the metallic sheet 14. During the first cycle in which the laser beams 21 and 22 ablate the metallic sheet 14, the laser beams 21 and 22 will also ablate a remaining portion of the dielectric layer 12 located above the blind surface 32, resulting in a metallic protrusion 30 between the troughs. The metallic protrusion 30 projects upward in a direction opposite to the direction 17, and includes curved (or curled) metallic strands 31 within a metal casing 38, wherein the metal casing 38 includes the metal of the metallic sheet 14. Defining the ablation threshold of a material as the minimum laser energy intensity capable of ablating the material, it is noted that the ablation threshold of the metallic sheet 14 is above the ablation threshold of the dielectric layer 12. Accordingly, the laser energy intensity profiles of the laser beams 21 and 22 are adjusted so as to: ablate the dielectric layer 12, ablate the trough portions of the metallic sheet 14 which are centered about the points 33 and 34, and reflow (i.e., liquify, but not ablate) metal of the portion of the metallic sheet 14 between the troughs (i.e., where the metallic protrusion 30 is formed). Some of the reflowed metal (e.g., reflowed copper) solidifies to form the metal casing 38 (e.g., a copper casing) within the metallic protrusion 30. The extremely high local temperature resulting from the laser ablation (e.g., as high as about 30,000° K) is thought to vaporize all or some of the constituents (e.g., carbon, silicon) of the dielectric layer 12. Some of the reflowed metal (e.g., copper) combines mechanically and adhesively with at least one constituent element from the ablated dielectric layer 12 (e.g., carbon, silicon), to form the metallic strands 31.

The "curved" metallic strands 31 generally include geometric shapes having non-zero curvature, but also include the special case of zero curvature corresponding to straight strands. Each metallic strand has a composition that is generally nonuniform and includes both the metal (e.g., copper) and at least one dielectric region 12 element (e.g., carbon, silicon). The metal (e.g., copper) in a metallic strand 31 originates from the reflowed portion of the metallic sheet 14, while the dielectric region 12 elements (e.g., carbon, silicon) in a metallic strand 31 result from condensation on the liquefied metal (e.g., liquefied copper) of gaseous elements (e.g., carbon, silicon) of the ablated dielectric layer 12. The metallic protrusion 30 comprises the metallic strands 31 in the metal casing 38. The metallic protrusion 30 is integral with a portion of the metallic sheet 14 that is under (i.e., below) the metallic protrusion 30.

A film 26 of dielectric debris (e.g., carbon) may form on the blind surface 32. Any method known to one of ordinary skill in the art, such as a standard chemical hole cleaning of carbonaceous matter, may be used to remove the film 26. After any such film 26 is removed, the blind surface 32 remains as clean and smooth, and thus in good condition for being etched.

Figure 3:
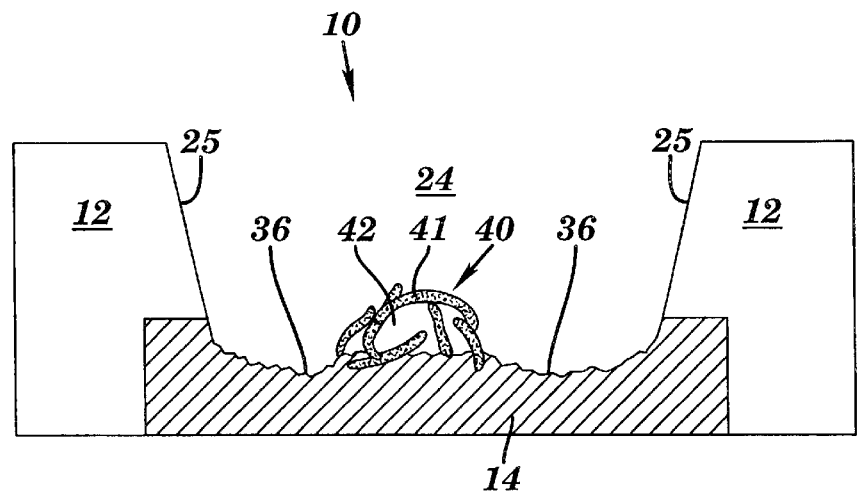
FIG. 3 depicts FIG. 2 after the metallic protrusion has been etched to form a metallic interlocking structure.
Figure 4:
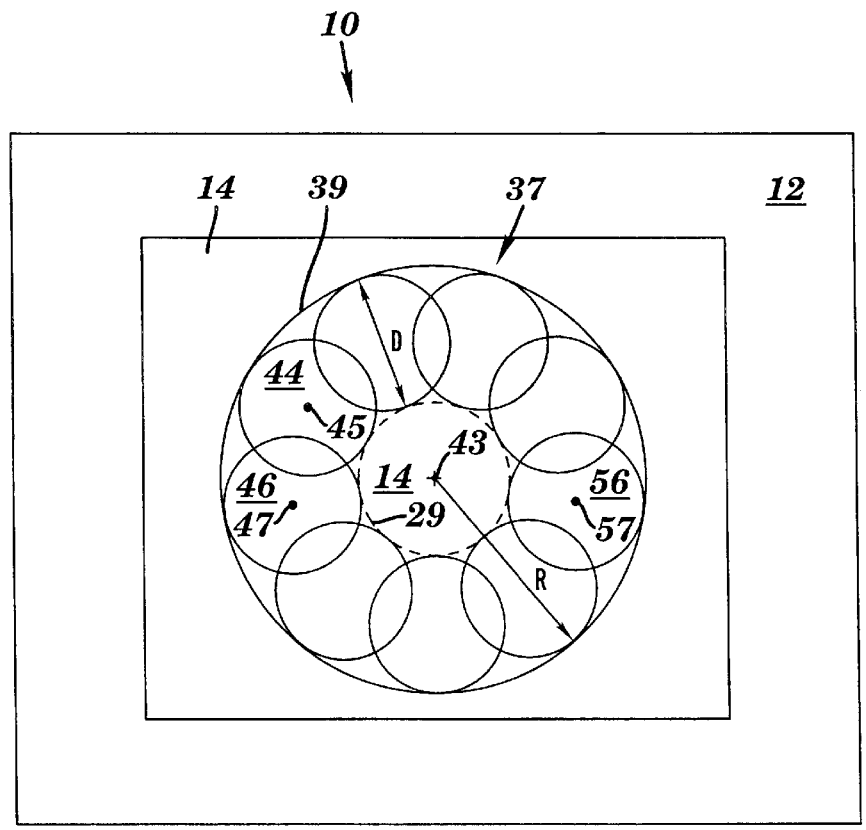
FIG. 4 depicts a top view of the substrate of FIG. 2, wherein the blind opening includes a blind via.

FIG. 3 illustrates FIG. 2 after the film 26 has been removed and an etchant has applied to both the blind surface 32 and the metallic protrusion 30, to prepare the blind surface 32 and the metallic protrusion 30 for subsequent metallic plating. Due to the etchant, the blind surface 32 in FIG. 2 is shown in FIG. 3 as the blind surface 36 in microetched (i.e., roughened) form, which improves the ability of subsequent metallic plating to adhere to the blind surface 36. The etchant etches the metallic protrusion 30 at an etch rate that varies spatially in accordance with a local composition of the metallic protrusion 30. In particular, the metal (e.g., copper) etches faster than the metallic strands 31, and each the metallic strands 31 may etch at a different rate because of the etch sensitivity of the dielectric constituents (e.g., carbon and silicon) to the etchant. The etch rate is also dependent on the spatial distribution of material within each metallic strand 31 insofar as the spatial distribution differentially exposes different amounts of surface area of the materials in each metallic strand 31 to the etchant. The differential etching of the metallic protrusion 30 transforms the metallic protrusion 30 into a metallic interlocking structure 40 comprising a labyrinth of curved (or curled) metallic fibers 41 in a background void 42. The "curved" metallic fibers 41 generally include geometric shapes having non-zero curvature, but also include the special case of zero curvature corresponding to straight fibers. The background void 42 results from etching of the metal and partial etching of the metallic strands 31. The curved metallic fibers 41 result from the partial etching of the remaining metallic strands 31. The metallic fibers 41 of the metallic interlocking structure 40 are derived from the metallic strands 31. Each metallic fiber 41 includes metal (e.g., copper) from the metallic sheet 14, at least one constituent element (e.g., carbon, silicon) of the dielectric layer 12, or combinations thereof. The etchant that should be used to transform the metallic protrusion 30 into the metallic interlocking structure 40 depends on the material composition of the metal casing 38 and of the metallic protrusion 30. Given the particular material-compositions involved, one of ordinary skill in the art may, without undue experimentation, choose an etchant that differentially etches portions of the metallic protrusion 30, by utilizing etchants known to etch the given materials, and easily testing the choice of etchant by examining the metallic interlocking structure 40 generated by the chosen etchant. The metallic interlocking structure 40 is not part of blind surface 36, but is coupled to the blind surface 36 such that the metallic interlocking structure 40 projects into the blind opening 24. The metallic interlocking structure 40 is integral with the portion of the metallic sheet 14 that is under (i.e., below) the metallic interlocking structure 40.

FIG. 4 illustrates a top view of the substrate of FIG. 2, wherein the blind opening 24 of FIG. 2 is represented in FIG. 4 as a blind via 37 having a substantially circular cross section that includes: a substantially circular boundary 39, a radius R, and a radial center 43. The circular boundary 39 corresponds to the sidewalls 25 of the blind opening 24 in FIG. 2. The laser drilling is within an outer ring of the substantially circular cross section, said outer ring between an inner circle 29 and the substantially circular boundary 39. FIG. 4 illustrates laser trepanning with overlapping target circles denoting laser interaction with both the metallic sheet 14 and the dielectric layer 12 (not shown) above the metallic sheet 14 at successive time intervals. For example, the target circle 44 (with radial center 45) overlaps the target circle 46 (with radial center 47). FIG. 4 illustrates an embodiment in which the laser beams 21 and 22 of FIG. 2 represent the same laser beam at different instances of time, by respectively corresponding to the target circle 46 (with radial center 47) and target circle 56 (with radial center 57) of FIG. 4. In FIG. 4, the target diameter D is between about 20% of R and about 150% of R. A value as high as about 150% for D is permitted, because, as stated supra, the laser light has its highest intensity at the center of the target circle and its intensity is relatively small at large distances from the center of the target circle (e.g., at distances of nearly 150% of R from the center of the target circle). Letting L represent the target displacement (i.e., the linear distance between successive pulses or target circles, such as between the radial center 45 and the radial center 47), the laser trepanning requires that L<D. It is within the scope of the present invention, however, to have non-trepanning laser drilling of the blind opening 24 characterized by non-overlapping target circles such that L≧D. Note that L is preferably between about 1 micron and about 25 microns.

Figure 5:
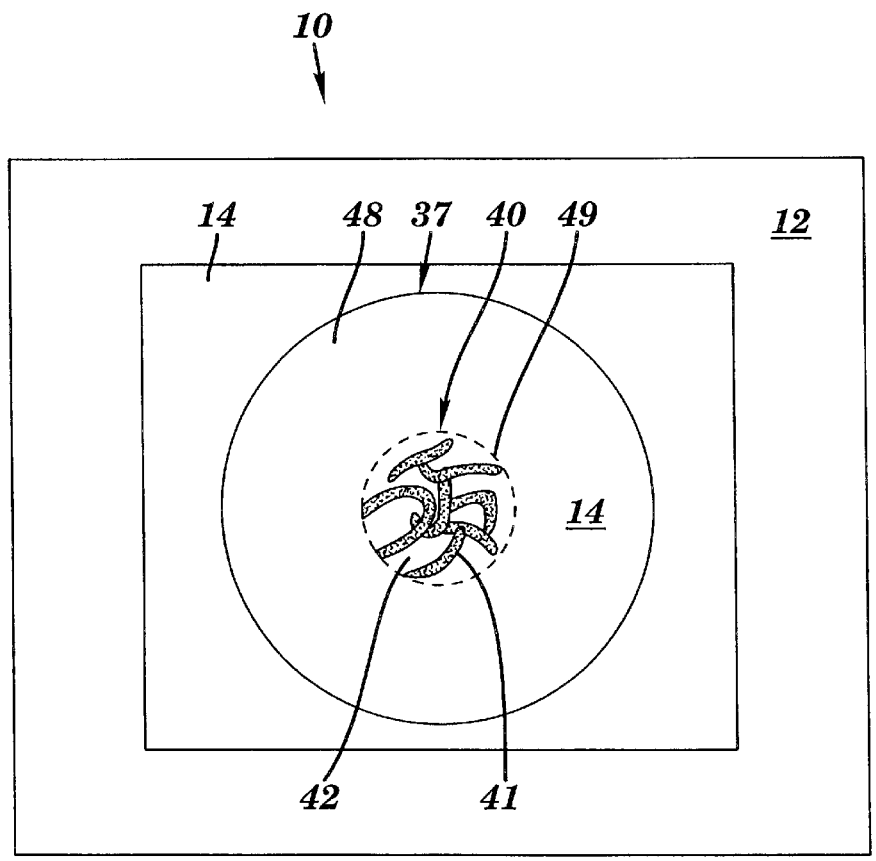
FIG. 5 depicts FIG. 4 after a metallic interlocking structure has been generated in the blind via.
Figure 6A:
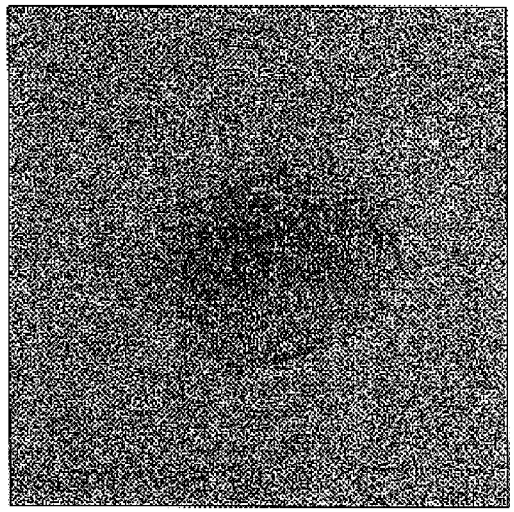
Figure 6B:
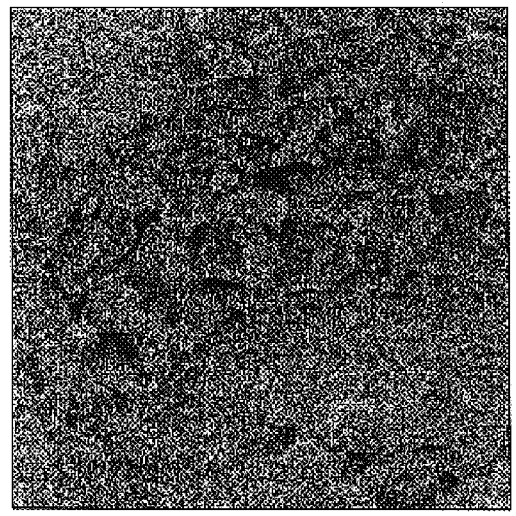
Figure 6C:
Figure 6D:
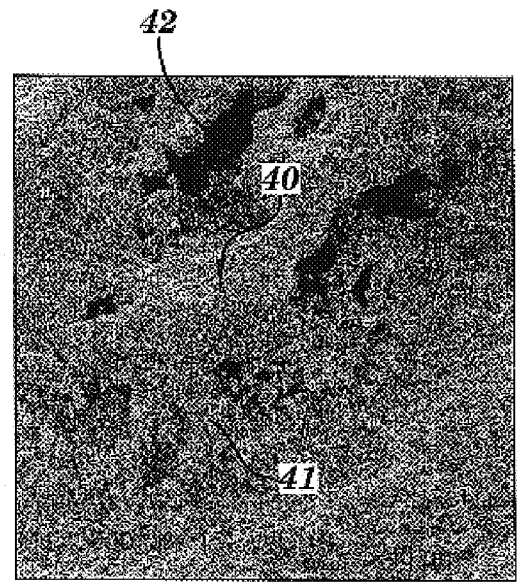

FIG. 5 illustrates FIG. 4 after the metallic interlocking structure 40 has been generated within the blind via 37. The blind via in FIG. 5 includes: a region 48 traversed by the target circles shown in FIG. 4, and the metallic interlocking structure 40 having an outer boundary 49 that bounds the curved metallic fibers 41 in the background void 42. The metallic interlocking structure 40 was formed by etching as described supra in conjunction with FIG. 3.

The present invention has been successfully reduced to practice for forming a blind via analogous to the blind via 37 in FIGS. 4 and 5, by using a metallic sheet 14 that includes copper, along with a dielectric layer 12 that includes an allylated polyphenylene ether resin (with a silica filler) made by the Asahi Chemical Company of Japan and identified as Asahi product number PC5103. The resulting metallic strands 31, as well as the metallic fibers 41, included copper, carbon, and silicon, with significantly more carbon than silicon. The etchant sodium persulphate was used to transform the metallic protrusion 30 into the metallic interlocking structure 40.

FIGS. 6A, 6B, 6C, and 6D illustrate the resultant metallic interlocking structure 40 at the middle portion of the bottom of a blind via formed in accordance with the above-described reduction to practice. FIGS. 6A, 6B, 6C, and 6D represent 500, 750, 1000, and 3000 magnification factors, respectively, and are otherwise the same. The metallic fibers 41 within the metallic interlocking structure 40 appear in FIG. 6D as curved within the background void 42, and the metallic interlocking structure 40 appears as a labyrinth mechanical structure in FIG. 6D. Examination of actually generated metallic fibers 41 of the reduced-to-practice representations in FIG. 6D reveals the metallic fibers 41 as comprising nonuniform distribution of copper and carbon, together with smaller amounts of silicon. The metallic fibers 41 have linear cross section dimensions between about 5 microns and about 10 microns.

Figure 8:
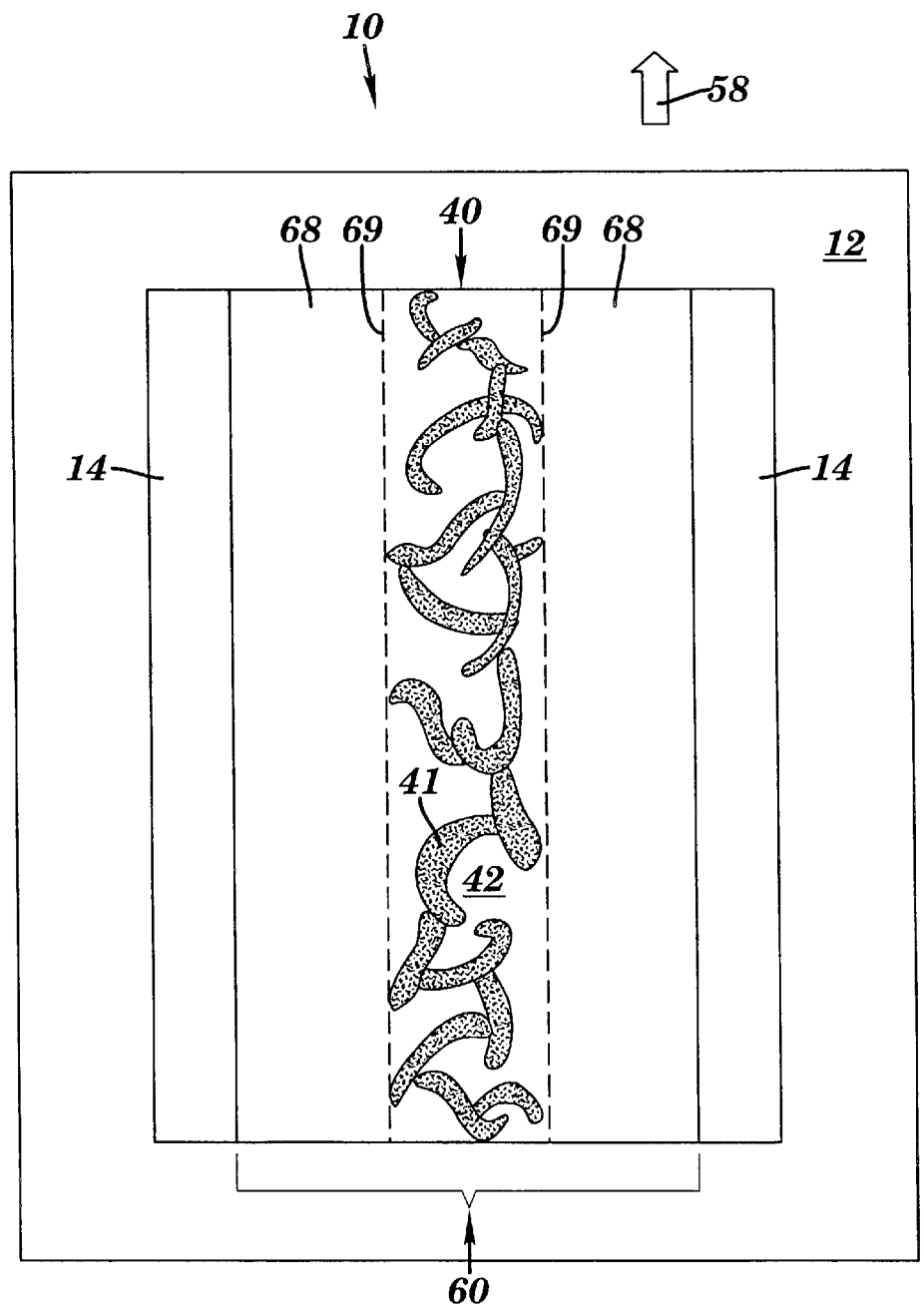
FIG. 8 depicts FIG. 6 after a metallic interlocking structure has been generated in the blind channel.

FIG. 7 illustrates a top view of the substrate of FIG. 2, wherein the blind opening 24 is represented in FIG. 7 as a blind channel 60 between channel boundaries 59 in the length direction 58. A "blind channel" is a channel in the substrate 10 that has a bottom blind surface within the substrate 10. The blind channel 60, of width W, has a centerline 63 that separates two laser paths 61 and 62. The channel boundaries 59 corresponds to the sidewalls 25 of the blind opening 24 in FIG. 2. FIG. 7 illustrates laser trepanning in each laser path 61 and 62, with each laser path 61 and 62 having overlapping target circles representing laser interaction with both the metallic sheet 14 and the dielectric layer 12 above the metallic sheet 14 (not shown in FIG. 7). In laser path 61, for example, a target circle 64 (with radial center 65) overlaps a target circle 66 (with radial center 67). In laser path 62, as another example, a target circle 74 (with radial center 75) overlaps a target circle 76 (with radial center 77). FIG. 7 illustrates an embodiment in which the laser beams 21 and 22 of FIG. 2 represent different laser beams synchronized in time; i.e. the laser drilling of the different laser beams 21 and 22 along the laser paths 61 and 62, respectively, is at the same position (or coordinate) along the length direction 58 at a given instant of time. In FIG. 7, the target diameter D is between about 10% and about 50% of W. Letting L represent the target displacement (i.e., the linear distance between the radial center 65 and the radial center 67, or between the radial center 75 and the radial center 77), the laser trepanning requires that L<D. It is within the scope of the present invention, however, to have non-trepanning laser drilling of the blind channel 60 characterized by non-overlapping target circles such that L≧D. Note that a traversal of the laser beams 21 and 22 across the entire length (i.e., in the direction 58) of the channel is called a "traversal cycle." Multiple traversal cycles over the same laser paths 61 and 62 may be necessary to achieve the desired depth of the channel FIG. 8 illustrates FIG. 7 after the metallic interlocking structure 40 has been generated within the blind channel 60. The blind channel 60 in FIG. 8 includes: a region 68 traversed by the target circles shown in FIG. 7, and the metallic interlocking structure 40 having an outer boundary 69 that bounds the curved metallic fibers 41 in the background void 42. The metallic interlocking structure 40 was formed by etching as described supra in conjunction with FIG. 3.

Figure 9:
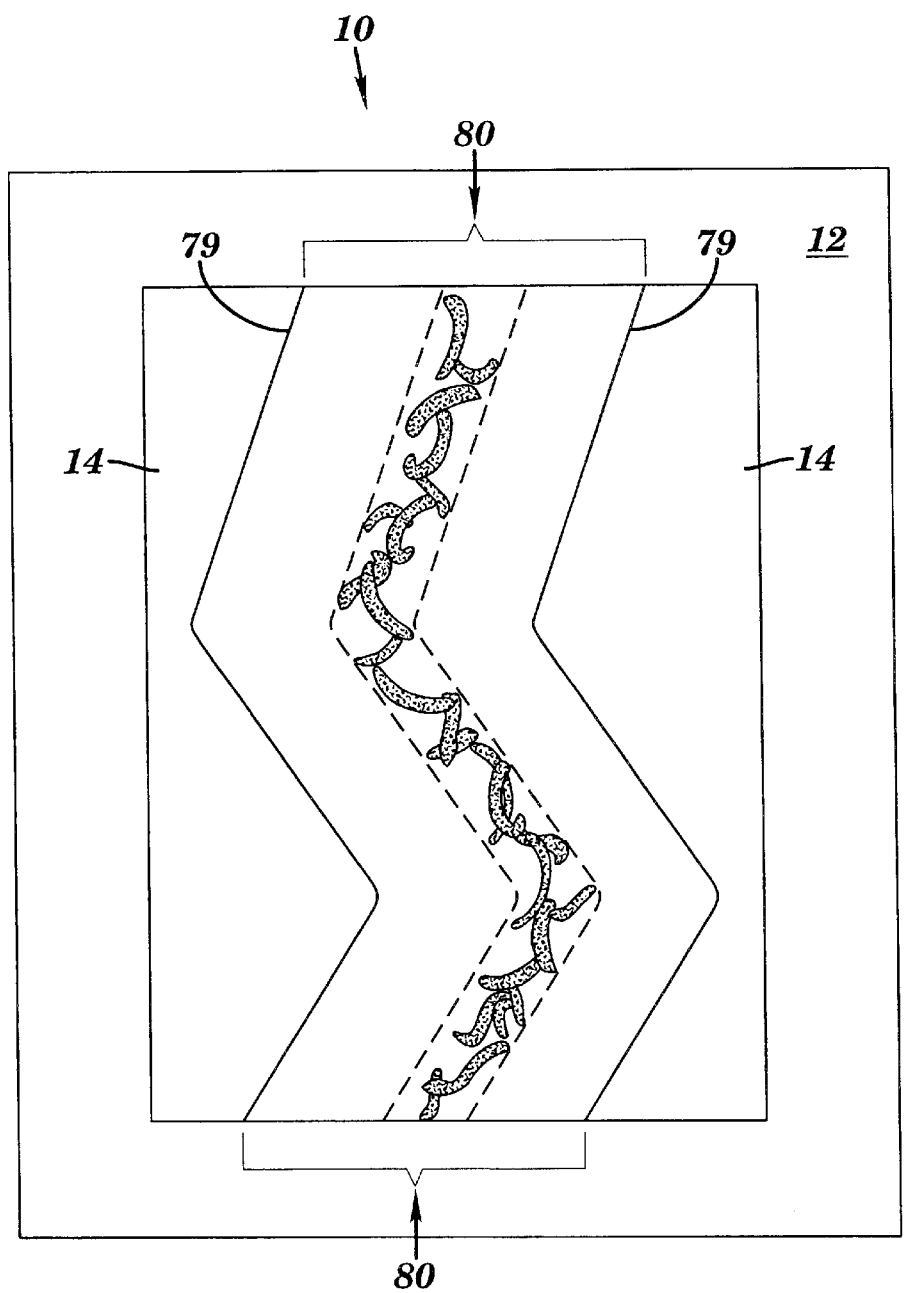
FIG. 9 depicts a top view of the substrate of FIG. 2, wherein the blind opening includes a blind pathway, and a metallic interlocking structure has been generated in the blind pathway.

FIG. 9 illustrates a top view of the substrate of FIG. 2, wherein the blind opening 24 is represented in FIG. 9 as a blind pathway 80 between boundaries 79. The blind channel 80 of FIG. 9 differs from the blind channel 60 of FIG. 8 in that the blind pathway 80 of FIG. 9 changes direction, while the blind channel 60 of FIG. 8 is oriented in the same direction 58. Aside from the aforementioned directional orientation, all of the considerations discussed supra in conjunction with FIGS. 7 and 8 for the blind channel 60 apply likewise to the blind pathway 80.

It is to be noted that a blind opening 24 (see FIGS. 2 and 3) of any geometry or topology is within the scope of the present invention, provided that the two laser beams 21 and 22 are utilized to form a metallic protrusion 30, or multiple metallic protrusions, between the troughs of the laser beams 21 and 22. For a blind opening 24 having a large cross section (i.e., a large length and large width normal to the depth directions multiple traversals over different spatial paths may be necessary to form a sufficient number of metallic protrusions 30 to adequately cover the surface of the cross section.

Figure 10:
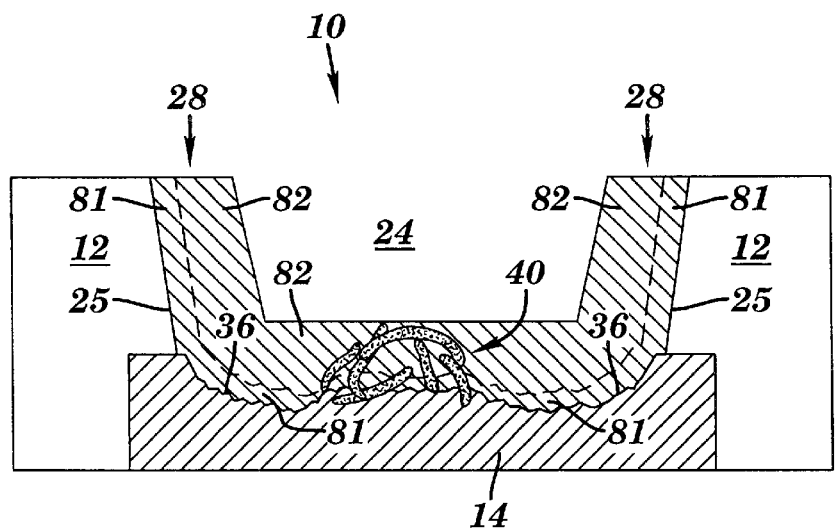
FIG. 10 depicts FIG. 3 with a metallic plating covering sidewalls, a blind surface of the blind opening, and the metallic interlocking structure.

FIG. 10 illustrates FIG. 3 with a plated layer 28 of a conductive metal, said plated layer 28 covering and filling the metallic interlocking structure 40, covering the blind surface 36, and covering the sidewalls 25 of the blind opening 24. The plated layer 28 may be formed by any method known to one of ordinary skill in the art. For example, after the sidewalls 25 are covered with a seeding material such as palladium, a first conductive layer 81 comprising a conductive metal may be electrolessly plated on a portion of the metallic interlocking structure 40, the blind surface 36, and the sidewalls 25. Then a second conductive layer 82 may be electroplated on the first conductive layer 81, as well as on and within the metallic interlocking structure 40, wherein the second conductive layer 82 includes the conductive metal. The plated layer 28 includes both the first conductive layer 81 and the second conductive layer 82. The blind opening 24, together with the plated layer 28 thereon, is called a "plated blind opening." Thus, the blind opening 24 may include a plated blind via having a substantially circular cross section. The metallic interlocking structure 40 interlocks very strongly with the plated layer 28. Indeed, the plating bond resulting from the metallic interlocking structure 40 is strong enough to allow metal surfaces to be plated even if such metal surfaces were to include a metal that would be difficult or impossible to plate without the metallic interlocking structure 40. Thus, the plating bond resulting from the metallic interlocking structure 40 is highly reliable with respect to, inter alia, thermal cycling, moisture absorption, and extended long-term operation.

Figure 11:
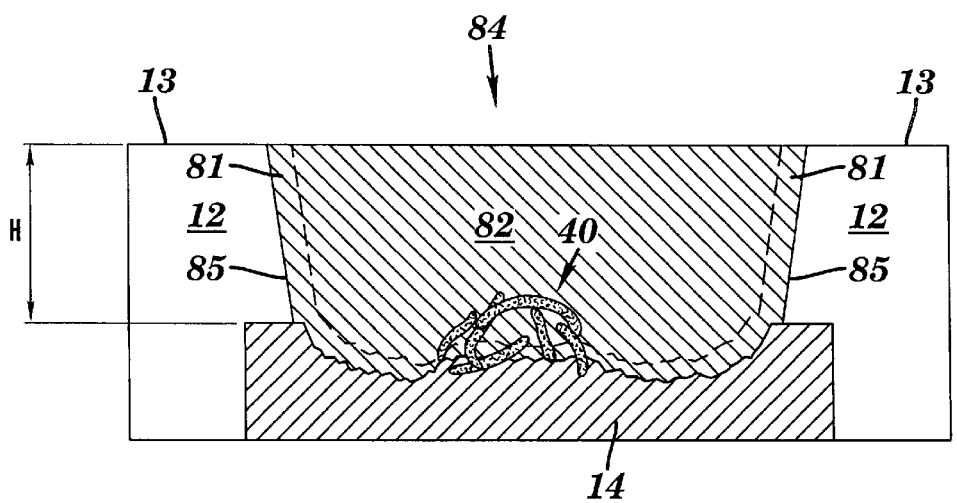
FIG. 11 depicts FIG. 10 with the metallic plating filling the blind opening to form a metallic plug.

FIG. 11 depicts FIG. 10 with the plated layer 28 filling the blind opening 24 to form a metallic plug 84. For the example of FIG. 10, the metallic plug 84 includes the first conductive layer 81 and the second conductive layer 82, wherein the second conductive layer 82 fills the blind opening 24 to about the level of the top surface 13 of the dielectric layer 12. The metallic plug 84 may include conductive wiring or a conductive circuit line, for any purpose.

Figure 12:
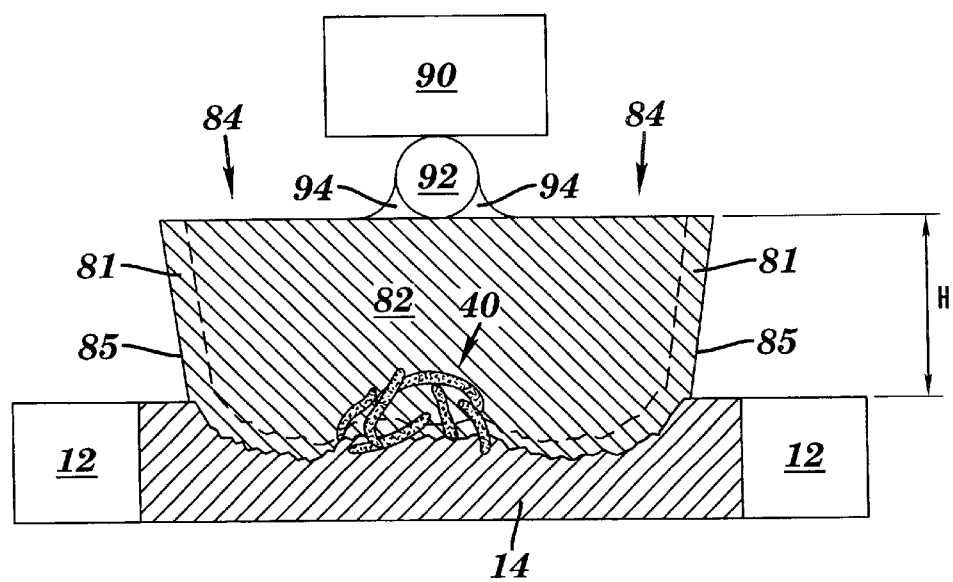
FIG. 12 depicts FIG. 11 with removal of dielectric layer material circumscribing the metallic plug.

FIG. 12 depicts FIG. 11 with removal of a height (or depth) H of dielectric layer 12 material that circumscribes the sidewalls 85 of the metallic plug 84, resulting in exposing the sidewalls 85. As a result, the metallic plug 84 has an exposed height H. Generally, $H \geq 0$. $H=0$ corresponds to FIG. 11, wherein the metallic plug 84 fills to about the top surface 13 of the dielectric layer 12. The removal of dielectric layer 12 material may be by any method known to one of ordinary skill in the art, such as by laser ablation or by chemical etching. The metallic plug 84 with the exposed sidewalls 85 may constitute conductive wiring or circuitry for any purpose, and may serve as a conductive pad for being conductively coupled to an electronic device. For example, the semiconductor chip 90 in FIG. 12 may be solderably and conductively coupled to the metallic plug 84 by use of a conductive contact 92. The conductive contact 92 may be, inter alia, a Controlled Collapse Chip Connection (C4) solder ball solderably interfaced with the metallic plug 84 by use of reflowed solder 94. The semiconductor chip 90 may alternatively be conductively coupled to the metallic plug 84 in the configuration of FIG. 11, or to the plated layer 28 in FIG. 10.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming an electronic structure, comprising the steps of:

providing a substrate having a metallic sheet interior to a dielectric layer, said metallic sheet including a metal;

laser drilling a blind opening through the dielectric layer and partially through the metallic sheet, said laser drilling creating a metallic protrusion that is integral with a portion of the metallic sheet, said metallic protrusion having metallic strands such that each metallic strand includes the metal and at least one constituent element from the dielectric layer; and etching a portion of the metallic protrusion to form a metallic interlocking structure that is integral with the portion of the metallic sheet and projects into the blind opening, wherein the resulting metallic interlocking structure includes discrete metallic fibers having a curved geometry, and wherein each metallic fiber has its own unique composition that includes material selected from a group consisting of the metal, the at least one constituent element of the dielectric layer, and combinations thereof.

2. The method of claim 1, wherein the metal includes copper, and wherein the at least one constituent element includes carbon.

3. The method of claim 2, wherein the least one constituent element further includes silicon.

4. The method of claim 1, wherein the metal includes copper, wherein the dielectric layer includes an allylated polyphenylene ether, and wherein the at least one constituent element includes carbon.

5. The method of claim 1, wherein the etching is at an etch rate that varies spatially in accordance with a local composition within the metallic protrusion.

6. The method of claim 1, further comprising forming a plated layer of a conductive metal on the blind opening by a process comprising:

forming a first conductive layer on a blind surface of the blind opening, on a portion of the metallic interlocking structure, and on a portion of sidewalls of the blind opening, wherein the first conductive layer includes the conductive metal; and forming a second conductive layer on the first conductive layer, including on and within the metallic interlocking structure, wherein the second conductive layer includes the conductive metal.

7. The method of claim 6, wherein the conductive metal includes the metal.

8. The method of claim 6, wherein the plated layer does not fill the blind opening.

9. The method of claim 8, wherein the plated blind opening includes a plated blind via having a substantially circular cross section.

10. The method of claim 6, wherein the plated layer fills the blind opening and forms a conductive plug.

11. The method of claim 10, wherein the blind opening includes a blind channel such that the conductive plug includes a conductive circuit line.

12. The method of claim 10, further comprising removing a portion of the dielectric layer that circumscribes sidewalls of the conductive plug, such that said sidewalls of the conductive plug are exposed.

13. The method of claim 12, wherein the removing is selected from the group consisting of chemical etching and laser ablating.

14. The method of claim 6, further comprising conductively coupling an electronic device to the conductive metal.

15. The method of claim 14, wherein the electronic device includes a semiconductor chip.

16. The method of claim 1, wherein the laser drilling includes outputting laser light having:

a wavelength between about 260 nm and about 540 nm;

an average power of between about 0.01 millijoules/pulse and about 0.10 millijoules/pulse;

a temporal pulse width between about 10 nanosec and about 150 nanosec; and a pulse repetition rate between about 4 kHz and about 20 kHz.

17. The method of claim 16, wherein the blind opening includes a blind via having a substantially circular cross section, and wherein the laser drilling is within an outer ring of the circular cross section with a laser pulse target circle having a target diameter between about 20% and about 150% of a radius of the circular cross section, and a displacement between successive pulses between about 1 micron and about 25 microns.

18. The method of claim 16, wherein the blind opening includes a blind channel that has a centerline separating a first laser path from a second laser path, wherein the laser drilling includes:

laser drilling along the first laser path with a laser pulse target circle having a target diameter between about 10% and about 50% of a blind channel width; and laser drilling along the second laser path with a laser pulse target circle having a target diameter between about 10% and about 50% of the blind channel width.

* * * * *